(12) United States Patent
Kiyose et al.

(10) Patent No.: US 6,914,465 B2
(45) Date of Patent: Jul. 5, 2005

(54) VOLTAGE-CONTROLLED OSILLATOR

(75) Inventors: Masashi Kiyose, Gifu (JP); Takuya Shiraishi, Higashiosaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/634,151

(22) Filed: Aug. 4, 2003

(65) Prior Publication Data

US 2004/0062161 A1 Apr. 1, 2004

(30) Foreign Application Priority Data

Aug. 2, 2002 (JP) .................................. 2002-226741
May 30, 2003 (JP) .................................. 2003-153872

(51) Int. Cl.[7] ................................................ H03L 7/06
(52) U.S. Cl. .................. 327/156; 375/376; 331/DIG. 2
(58) Field of Search ................................ 327/144–151, 327/156–160; 375/373–376; 331/11, 1 A, DIG. 2

(56) References Cited

U.S. PATENT DOCUMENTS

| 4,511,859 | A | * | 4/1985 | Dombrowski | 331/11 |
|---|---|---|---|---|---|
| 5,072,195 | A | * | 12/1991 | Graham et al. | 331/2 |
| 5,088,080 | A | * | 2/1992 | Ishibashi et al. | 369/44.26 |
| 5,363,419 | A | * | 11/1994 | Ho | 375/376 |
| 5,933,037 | A | * | 8/1999 | Momtaz | 327/157 |
| 5,982,208 | A | * | 11/1999 | Kokubo et al. | 327/119 |
| 6,215,835 | B1 | * | 4/2001 | Kyles | 375/376 |

* cited by examiner

*Primary Examiner*—Minh Nguyen
(74) *Attorney, Agent, or Firm*—Fish & Richardson P.C.

(57) ABSTRACT

A PLL circuit that optimally generates a clock signal with two reference signals having different frequencies. The PLL circuit includes a VCO for generating the clock signal in accordance with a control voltage. A first loop controls the frequency of the clock signal in accordance with a first reference signal. A second loop controls the phase of the clock signal in accordance with a second reference signal, whose cycle is longer than that of the first reference signal. The second loop supplies the VCO with the control voltage at a constant value until the difference between the frequencies of the first reference and clock signals converges to within a predetermined range. Then, the second loop supplies the VCO with a control voltage at a level corresponding to the difference between the phases of the second reference and clock signals.

14 Claims, 8 Drawing Sheets

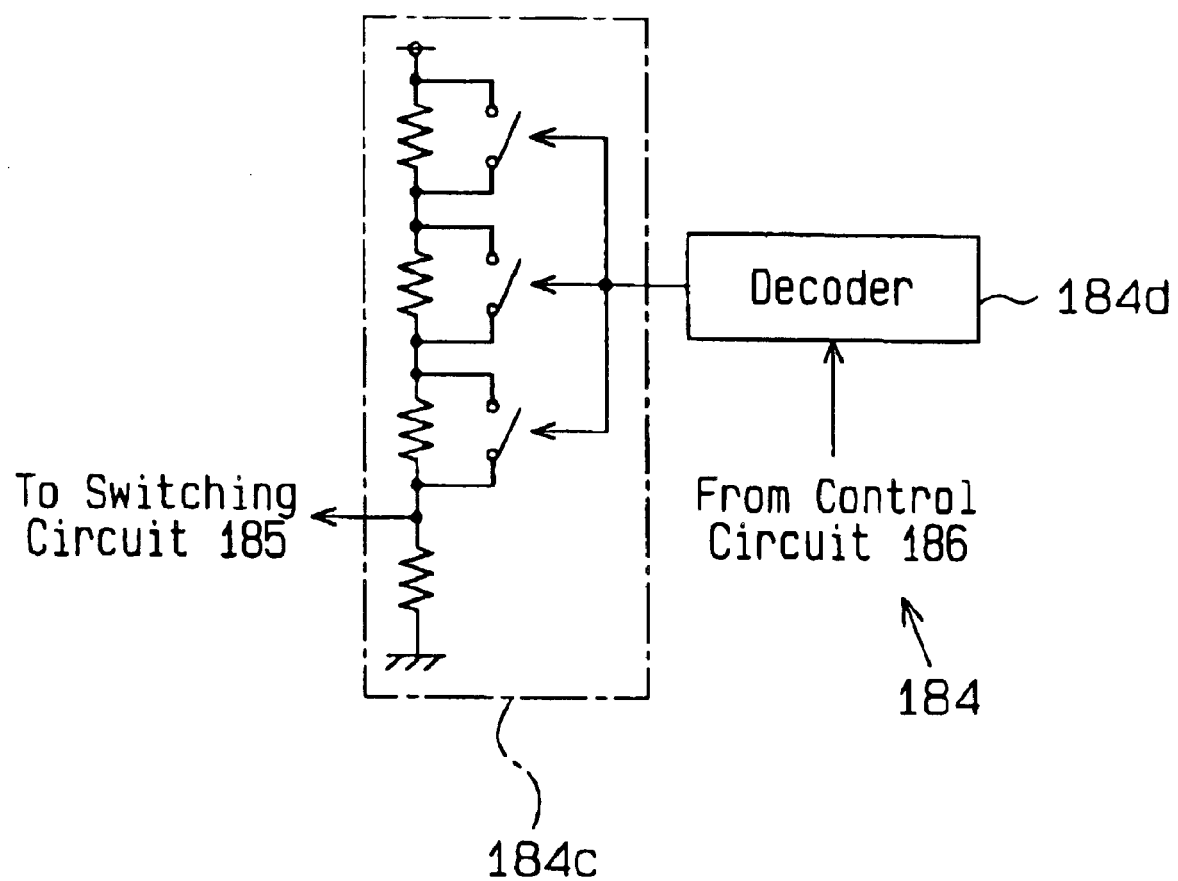

VOLTAGE-CONTROLLED OSILLATOR

BACKGROUND OF THE INVENTION

The present invention relates to a PLL circuit that generates a clock signal used to control the recording of data to, for example, a disc medium, and a data recording controller.

Disc media, such as an optical disc, is nowadays widely used as recording media. Data recordable recording media include, for example, a digital versatile disc-recordable (DVD-R) and a digital versatile disc-rewritable (DVD-RW). A DVD-RW includes a track, which is formed by grooves between lands. The grooves are slightly wobbled. This enables a wobble signal having a predetermined cycle to be extracted from the wobbled grooves. The wobbling is formed in correspondence with a data recording region, which is in a DVD data format and has a predetermined data length.

In addition to the wobbling, the disc medium has land prepits (LPPs), which include disc position information, formed at predetermined intervals along the track. An LPP signal is generated by reproducing the LPPs. The LPP signal is generated at a rate of 1 to 3 pulses per 16 pulses of the wobble signal. Disc position information is retrieved from the LPP signal.

A laser beam is emitted on to the disc medium, the rotation of which is controlled, to record data on the disc medium. When recording data, it is preferred that the data recording be performed in accordance with a reference clock signal corresponding to the rotation of the disc medium. By using the reference clock signal, the recording region for one bit of data recorded on the disc medium is constant. Thus, the recoding of data is accurately controlled.

The reference clock signal is acquired by reproducing the wobble signal and generating a pulse signal, which is synchronized with the wobble signal, with a PLL circuit. More specifically, a phase comparator compares the phases of the clock signal, the oscillation of which is controlled by a voltage-controlled oscillator, and the wobble signal. The voltage corresponding to the frequency difference or phase difference of the two signals is fed back to the voltage-controlled oscillator to synchronize the clock signal, which is generated by the voltage-controlled oscillator, with the wobble signal.

When generating the reference clock signal with the PLL circuit, it is preferred that the LPP signal be used instead of the wobble signal. However, the frequency of the LPP signal is lower than that of the wobble signal. In addition, since there are only one to three LPP signal pulses for every pulse of the wobble signal, the LPP signal pulses do not necessarily correspond with the 16 pulses of the wobble signal. Thus, it is difficult to generate a clock signal that is accurately synchronized with the LPP signal;

In addition to the LPP signal and the wobble signal, under circumstances in which there are two signals having different frequencies, the same problem occurs when generating a clock signal synchronized with a signal, which is not easily synchronized with since its pulses do not appear frequently.

SUMMARY OF THE INVENTION

One aspect of the present invention is a PLL circuit for use with first and second reference signals, with each reference signal having a phase, cycle, and frequency, and the cycle of the second reference signal being longer than that of the first reference signal. The PLL circuit includes a voltage controlled oscillator for generating a clock signal in accordance with a control voltage, and the clock signal having a phase and frequency. A first loop controls the frequency of the clock signal in accordance with the first reference signal. A second loop controls the phase of the clock signal in accordance with the second reference signal with the second loop generating the control voltage at a constant value and supplying the voltage controlled oscillator with the constant control voltage until the difference between the frequency of the first reference signal and the frequency of the clock signal converges to within a predetermined range. Thereafter, the second loop generates control voltage at a level in accordance with the difference between the phase of the second reference signal and the phase of the clock signal and supplies the voltage controlled oscillator with the control voltage at the level in accordance with the phase difference.

Another aspect of the present invention is a data recording controller for generating a data write clock signal having a phase and frequency with a first signal indicating position information obtained from a disc medium, the rotation of which is controlled, and a second signal. The first and second signals each have a phase, cycle, and frequency. The cycle of the second signal is longer than that of the first signal. The data recording controller includes a voltage controlled oscillator for generating the clock signal in accordance with a control voltage. A first loop controls the frequency of the clock signal in accordance with the first signal. A second loop controls the phase of the clock signal in accordance with the second signal, with the second loop generating the control voltage at a constant value and supplying the voltage controlled oscillator with the constant control voltage until the difference between the frequency of the first signal and the frequency of the clock signal converges to within a predetermined range. Thereafter, the second loop generates the control voltage at a level in accordance with the difference between the phase of the second signal and the phase of the clock signal and supplying the voltage controlled oscillator with the control voltage at the level in accordance with said phase difference.

A further aspect of the present invention is a method for controlling a voltage controlled oscillator of a PLL circuit. The method includes supplying the voltage controlled oscillator with a control voltage to generate a clock signal, which has a frequency and phase, in accordance with the control voltage, controlling the frequency of the clock signal in accordance with a first signal having a frequency and cycle, and controlling the phase of the clock signal in accordance with a second signal having a phase and a cycle with the cycle of the second signal being longer than the cycle of the first signal. The controlling of the phase of the clock signal includes generating the control voltage at a constant value and supplying the voltage controlled oscillator with the constant control voltage until the difference between the frequency of the first signal and the frequency of the clock signal converges to within a predetermined range, and generating a voltage at a level in accordance with the difference between the phase of the second signal and the phase of the clock signal and supplying the voltage controlled oscillator with the voltage at the level in accordance with the phase difference after the difference between the frequency of the first signal and the frequency of the clock signal has been converged to within the predetermined range.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 13 is a schematic circuit diagram of a voltage generation circuit in the data recording controller of FIG. 1.

DETAILED DESCRIPTION OF THE PREFERRED EMBODIMENTS

Figure 1:
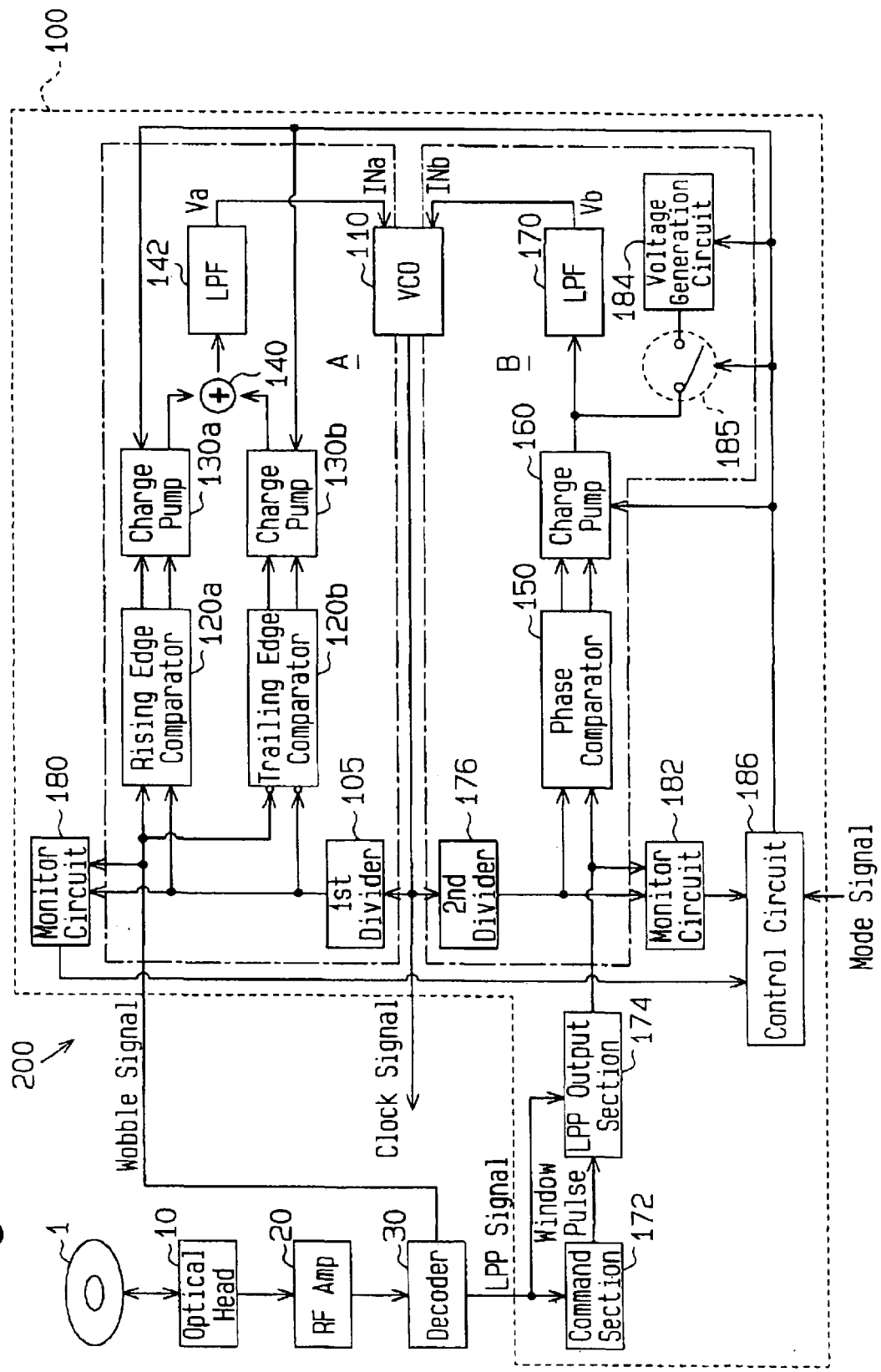
FIG. 1 is a schematic block diagram of a data recording controller according to a first embodiment of the present invention.

In the drawings, like numerals are used for like elements throughout.

FIG. 1 is a schematic block diagram of a data recording controller 200 according to a preferred embodiment of the present invention. The data recording controller 200 is employed as a DVD-R data recording controller.

An optical disc 1, which is a disc medium, is the recording subject of the data recording controller 200. The optical disc 1 is, for example, a data writeable (recordable) DVD-R disc. A pregroove, which functions as a guide groove of the optical disc 1, extends spirally in the disc 1. Land prepits (LPPs) are formed near the pregrooves.

The pregroove extends in a wobbled manner along the optical disc 1. A signal including a wobble component has a frequency of 140.6 kHz. The LPPs are formed at predetermined intervals along the optical disc 1. The interval is set so that a signal having 1 pulse per about 16 pulses of the wobble signal may be obtained. An LPP signal is generated by reproducing the LPPs.

The data recording controller 200 includes an optical head 10, an RF amplifier 20, a decoder 30, and a clock generator 100. The optical head 10 emits a laser beam onto the optical disc 1 and receives the reflection of the laser beam from the optical disc 1. The RF amplifier 20 generates a binary digital signal from the reflection received by the optical head 10. The decoder 30 decodes the digital signal and generates the wobble signal and the LPP signal.

The clock generator 100 generates a clock signal, which is used by the data recording controller 200, in accordance with the wobble signal and the LPP signal. More specifically, the clock generator 100 generates the clock signal with a frequency that is 5952 times greater than the frequency of the LPP signal. In other words, the clock signal has 5952 pulses between two LPP signal pulses. The clock signal has a frequency of 52.32 MHz.

After synchronizing the frequency of the clock signal with the frequency of the wobble signal, the clock generator 100 synchronizes the phase of the clock signal with the phase of the LPP signal. More specifically, after the difference between the frequencies of the wobble signal and the clock signal converges to within a predetermined range, the clock generator 100 phase-controls the clock signal in accordance with the LPP signal. This is because the generation of the clock signal in synchronization with the LPP signal is difficult since the frequency of the LPP signal is lower than the frequency of the wobble signal and the LPPs formed in the disc medium may be lost when data is recorded. In the preferred embodiment, the clock signal is roughly adjusted in accordance with the wobble signal. Then, the roughly adjusted clock signal is finely adjusted in accordance with the LPP signal to generate the clock signal with its phase synchronized to that of the LPP signal.

The clock generator 100 includes two phase-locked loops (PLLs). One of the two loops is a first loop A and the other is a second loop B. The first loop A synchronizes the frequency of a first divisional clock signal, which is generated by a first divider 105, with the frequency of the wobble signal. The second loop B synchronizes the phase of a second divisional clock signal, which is generated by a second divider 176, with the phase of the LPP signal. The first loop A and the second loop B share the same voltage-controlled oscillator (VCO) 110. The VCO 110 has a first control voltage input terminal INa and a second control voltage input terminal INb. The first control voltage input terminal INa is supplied with a first control voltage corresponding to the difference between the frequency of the first divisional clock signal and the frequency of the wobble signal. The second control voltage input terminal INb is supplied with a second control voltage corresponding to the difference between the phase of the second divisional clock signal and the phase of the LPP signal.

Figure 2:
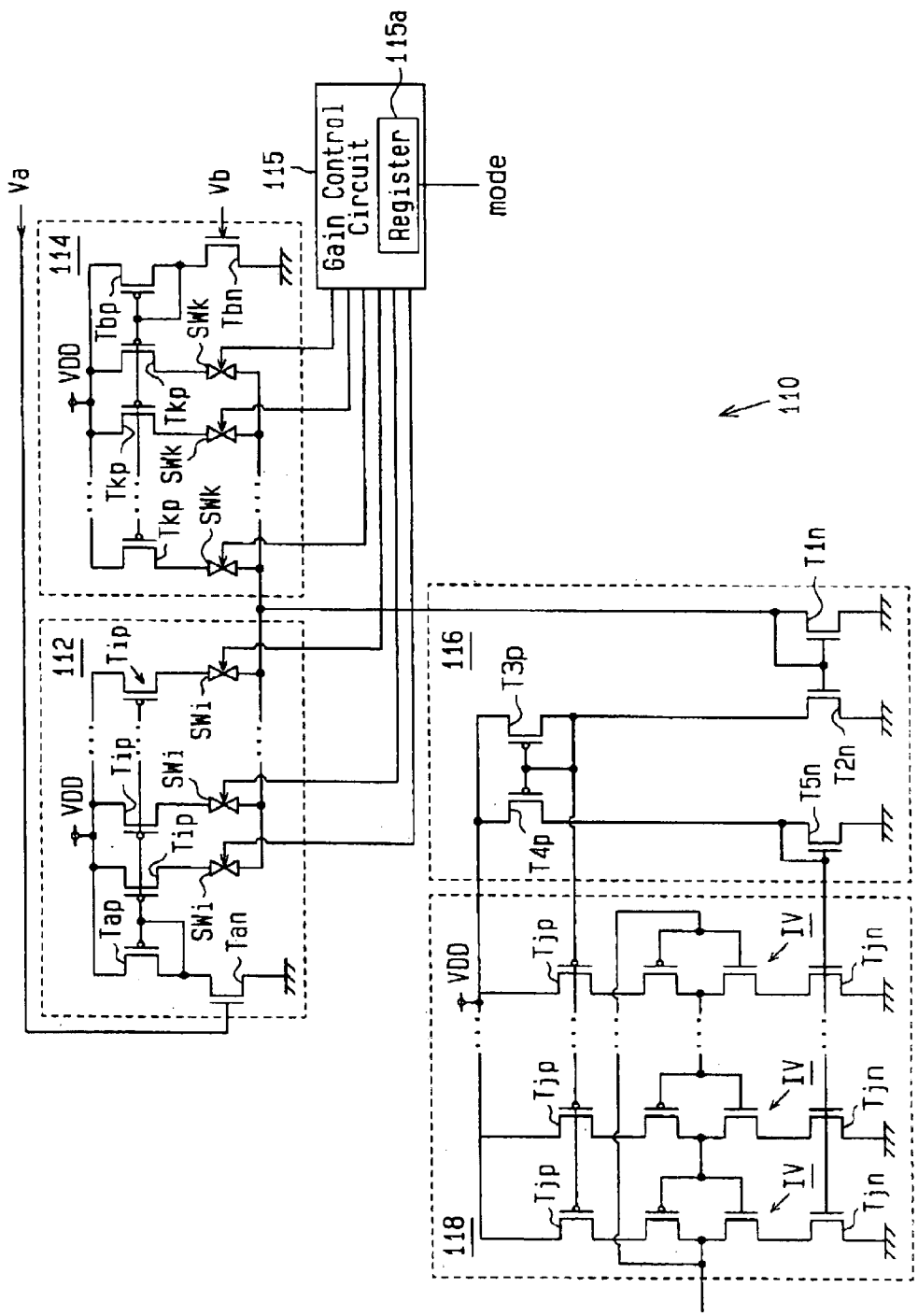
FIG. 2 is a schematic circuit diagram of a voltage-controlled oscillator in the data recording controller of FIG. 1.

The VCO 110, which is shared by the first loop A and the second loop B, will now be discussed. FIG. 2 is a schematic circuit diagram of the VCO 110.

As shown in FIG. 2, the VCO 110 includes a first current source 112, a second current source 114, a gain control circuit 115, a control voltage generation circuit 116, and a ring oscillator 118.

The first current source 112 adjusts the gain to drive the ring oscillator 118 with a control current corresponding to the first control voltage input from the first control voltage input terminal INa. More specifically, the first current source 112 includes a plurality of output current channels, each of which is configured by a p-channel transistor Tip, and a plurality of switches SWi, each of which is connected in series to an associated one of the output current channels. The output current channel and the switches SWi are connected in parallel between the power supply VDD and the output of the first current source 112. In accordance with the gain control circuit 115, the switches SWi connect and disconnect the power supply VDD and the output. The gain control circuit 115 sets the number of stages of the output current channels to be used, which are connected in parallel to each other.

Further, the first current source 112 includes an input current circuit configured by an n-channel transistor Tan and a p-channel transistor Tap, which are connected in series between the power supply VDD and the ground. The amount of current that flows through the p-channel transistor Tap and the voltage at the gate of the transistor Tap are determined in accordance with the level of the first control voltage, which is applied to the gate of the n-channel transistor Tan. Voltage that is equal to the gate voltage of the transistor Tap is applied to the gate of each p-channel transistor Tip, which is a current mirror connected to the p-channel transistor Tap. This determines the amount of current flowing between the source and drain of each p-channel transistor Tip. Accordingly, the amount of current output from the first current source 112 is controlled in accordance with the level of the first control voltage.

The second current source 114 has the same configuration as that of the first current source 112. The second current source 114 adjusts the gain to drive the ring oscillator 118 with a control current corresponding to the second control voltage input from the second control voltage input terminal INb. This controls the amount of current output from the second current source 114 in accordance with the level of the second control voltage.

The gain control circuit 115 controls the first current source 112 and the second current source 114 in accordance with the mode data stored in a register 115a. That is, the gain control circuit 115 selectively opens and closes the switches SWi of the first current source 112 and the switches SWk of the second current source 114 to adjust the fluctuation rate of the output current of the first and second current sources 112 and 114 in accordance with fluctuations in the first and second control voltages.

The control voltage generation circuit 116 converts a current signal, which is provided to each of the current sources 112 and 114, to a voltage signal. The control voltage generation circuit 116 includes two stages of current mirror circuits, which are configured by n-channel transistors T1$n$ and T2$n$ and p-channel transistors T3$p$ and T4$p$. The gate bias voltage of an n-channel transistor T5$n$, which is series-connected to a p-channel transistor T4$p$ of the second stage current mirror circuit, is supplied to the ring oscillator 118.

The ring oscillator 118 includes an odd number of inverters IV connected between the power supply VDD and the ground. The amount of current supplied to each of the inverters IV is controlled in accordance with the first and second control voltages. More specifically, a p-channel transistor Tjp is connected between the power supply VDD and each inverter IV. Further, an n-channel transistor Tjn is connected between each inverter IV and the ground. The voltage corresponding to the output currents of the first and-second current sources 112 and 114 is applied to the transistors Tjp and Tjn, which control the amount of current flowing through the inverters IV, via the control voltage generation circuit 116.

Figure 3:
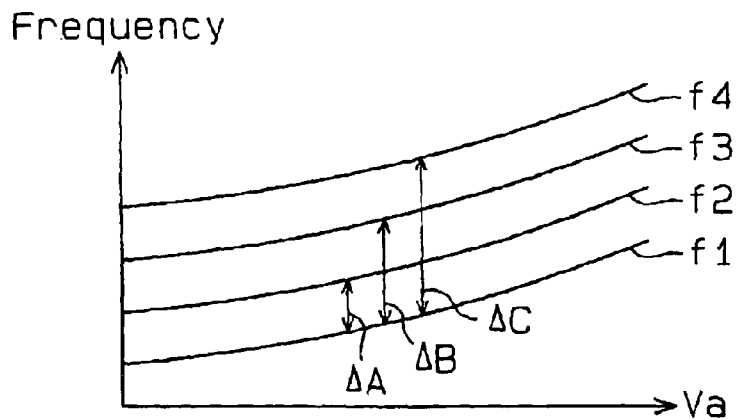
FIGS. 3 to 6 are graphs illustrating the characteristics of a wobble signal and an LPP signal.

The characteristics of the VCO 110 will now be discussed. FIG. 3 is a graph illustrating the relationship between the first control voltage applied to the first control voltage input terminal INa and the oscillation frequency of the VCO 110. In FIG. 3, curve f1 is obtained when the voltage applied to the control voltage input terminal INb is zero. As apparent from FIG. 3, the oscillation frequency increases as the first control voltage increases.

Curves f2 to f4 are obtained when applying the voltage of the power supply VDD to the second control voltage input terminal INb. The number of stages in the output current channel of the second current source 114 is one, two, and three for the curves f2, f3, and f4, respectively. As shown in FIG. 3, when the first control voltage is constant, the oscillation frequency increases as the number of stages of the output current channels used in the second current source 114 increases.

When the first control voltage is constant and the second control voltage applied to the second control voltage input terminal INb is variable, the bandwidth of the oscillation frequency increases as the number of stages of the output current channels used in the second current source 114 increases ($\Delta A < \Delta B < \Delta C$).

Figure 4:
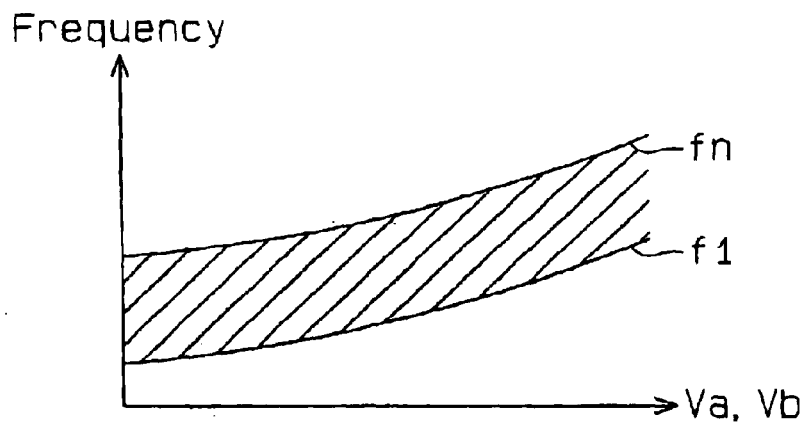

The slanted lines in FIG. 4 show the oscillation frequency bandwidth of the VCO 110 when the stages of the output current channels in the second current source 114 are fixed to a predetermined number "n" and the first and second control voltages are variable.

Figure 5:
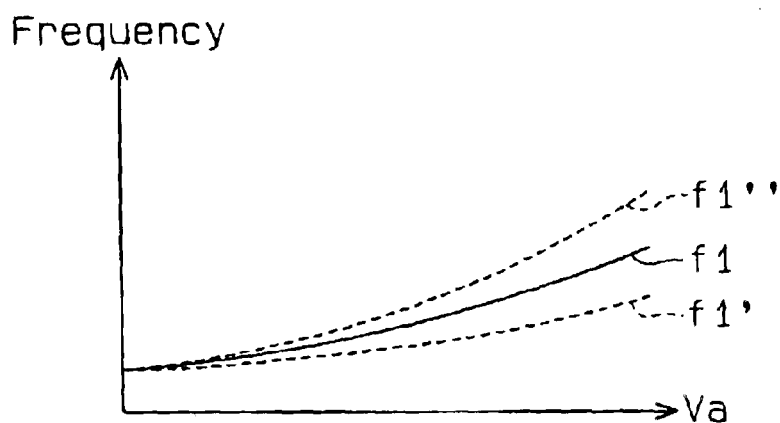

FIG. 5 shows the relationship of the first control voltage and the oscillation frequency when the second control voltage applied to the second control voltage input terminal INb is zero and the number of stages of the output current channels in the first current source 112 is changed. The number of stages of the output current channels in the first current source 112 increases in the order of curve f1', curve f1, and curve f1". As shown in FIG. 5, the increase rate of the oscillation frequency relative to the change in the first control voltage increases as the number of stages of the output current channels in the first current source 112 increases.

The characteristics schematically shown in FIGS. 3 to 5 are also obtained when the first control voltage input terminal INa is reversed with the second control voltage input terminal INb.

Figure 6:
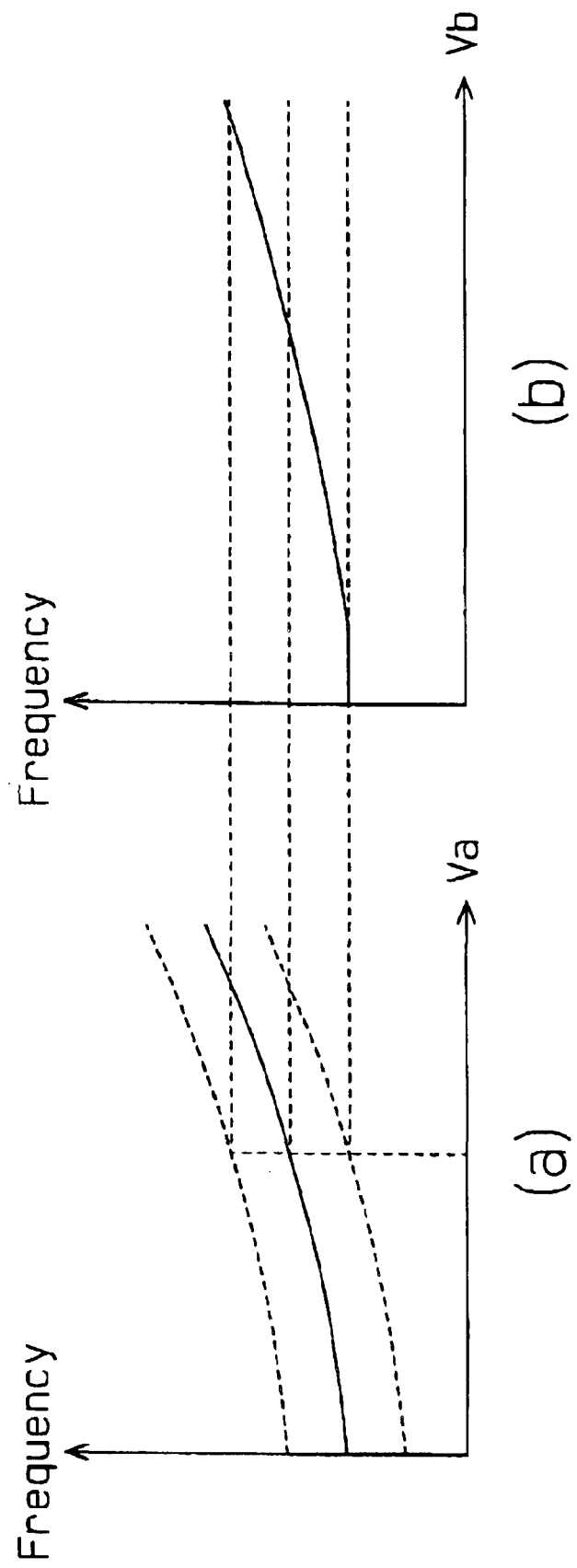

In the VCO 110, which has the two control voltage input terminals INa and INb, the output voltage Va of a low pass filter 142 (first control voltage) is applied to the first control voltage input terminal INa, and the output voltage Vb of a low pass filter 170 (second control voltage) is applied to the second control voltage input INb. This synchronizes the frequency of the clock signal (more accurately, the first divisional clock signal), which is generated by the VCO 110, and the frequency of the wobble signal with the first control voltage input terminal INa, and the phase of the clock signal (more accurately, the second divisional clock signal) and the phase of the LPP signal with the second control voltage input terminal INb. In other words, the first control voltage Va roughly adjusts the oscillation frequency of the VCO 110 as shown in FIG. 6($a$), and the second control voltage Vb finely adjusts the oscillation frequency as shown in FIG. 6($b$).

The first loop A and the second loop B of the VCO 110 will now be discussed. The first loop A compares the rising edges and trailing edges of the first divisional clock signal and the wobble signal and controls the VCO 110 in accordance with the comparison result. The rising and trailing edges are both used for the reasons described below.

Figure 7:
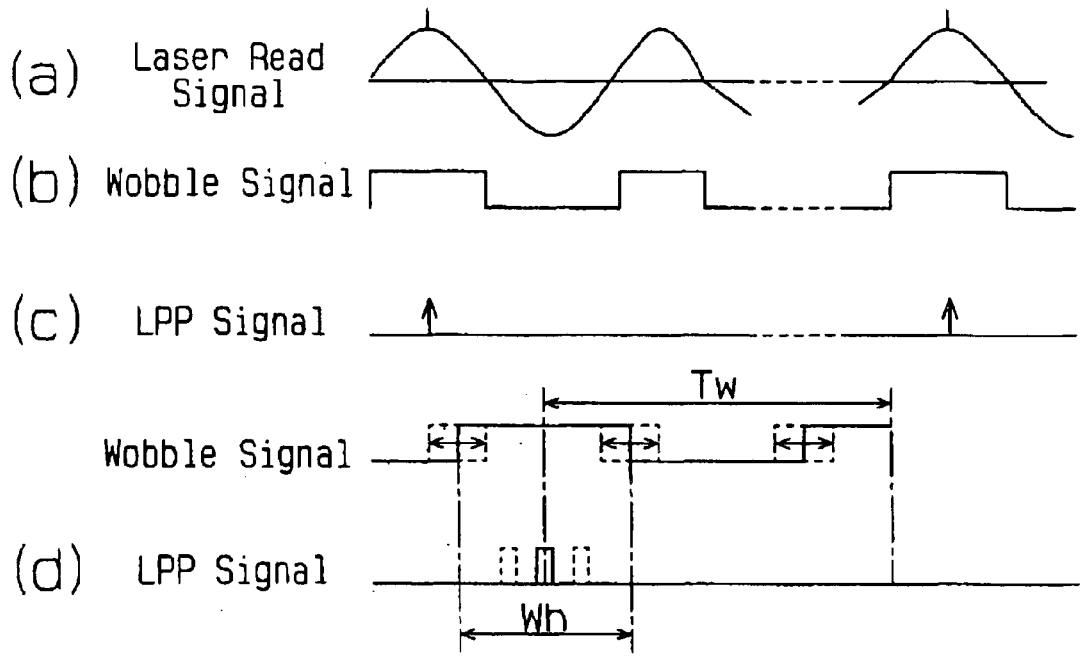
FIG. 7 is a time chart illustrating the characteristics of the wobble signal and the LPP signal.

The RF amp 20 generates the binary wobble signal shown in FIG. 7($b$) from the signal of FIG. 7($a$), which corresponds to the wobble of the disc medium and which is read by the laser beam. The duty ratio of the wobble signal fluctuates. Thus, when controlling the VCO 110 in accordance with the difference between the phases of the divisional clock signals and the wobble signal, the control of the VCO 110 may be affected by the fluctuations of the duty ratio.

However, the cycle Tw between the centers of pulses and the phase of the wobble signal remain constant even when the pulse width Wh changes, as shown in FIG. 7($d$). Accordingly, the VCO 110 is controlled in accordance with the phase and the cycle Tw between pulse centers of the wobble signal and in accordance with the phase and the cycle between pulse centers of the divisional clock signals. This prevents the control of the VCO 110 from being affected by changes in the duty ratio.

More specifically, the first loop A of FIG. 1 includes a rising edge comparator 120a and a trailing edge comparator 120b to compare the rising edges and trailing edges of the wobble signal and the first divisional clock signal. A signal generated in accordance with the comparison result is provided from each of the comparators 120a and 120b to an associated one of charge pumps 130a and 130b and converted to a predetermined charge pump output signal. The two charge pump signals are synthesized by an adder 140, smoothed by the low pass filter 142, and then applied as the first control voltage to the first control voltage input terminal INa of the VCO 110. The first divider 105 divides the clock signal, which is controlled by the first control voltage, and provides the divided signal to the rising edge comparator 120a and the trailing edge comparator 120b. The first divisional clock signal is controlled so that its frequency is synchronized with the frequency of the wobble signal. The dividing ratio of the first divisional clock signal is "1/372." Thus, the output signal of the VCO 110 is controlled at "52.32 MHz".

Figure 8:
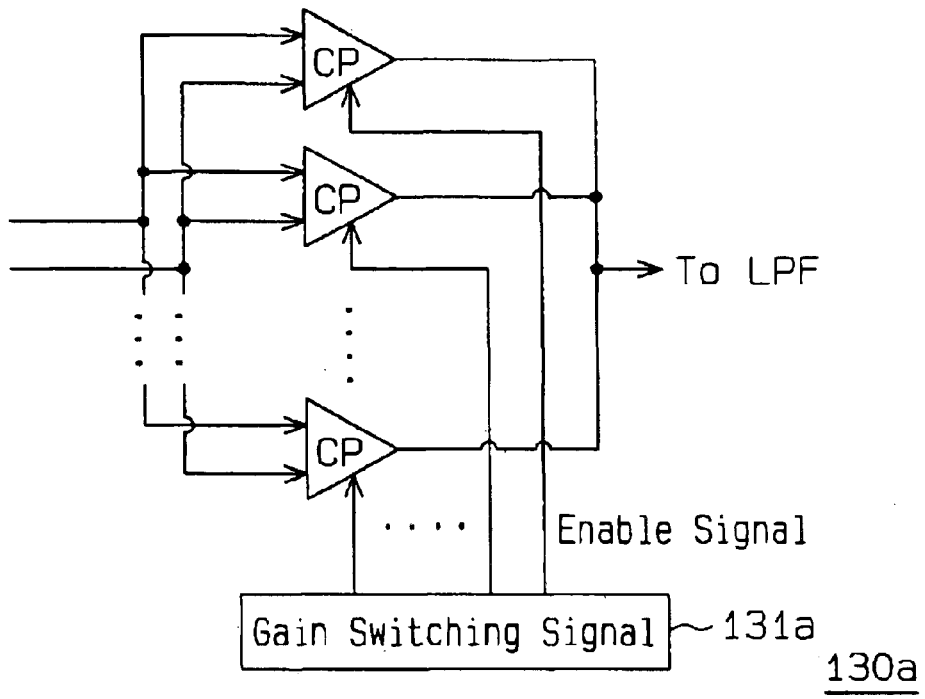
FIG. 8 is a schematic diagram of a charge pump in the data recording controller of FIG. 1.

Referring to FIG. 8, the gain of the charge pump 130a is variable. The charge pump 130a includes a plurality of charge pump units CP, which output current corresponding to the output signal of the rising edge comparator 120a, and a gain switching circuit 131a, which drives selectively some of the charge pump units CP. The gain switching circuit 131a switches the number of stages of the driven charge pump units CP to switch the gain of the charge pump 130a, or the amount of current output from the charge pump 130a relative to the phase comparison output.

Figure 9:
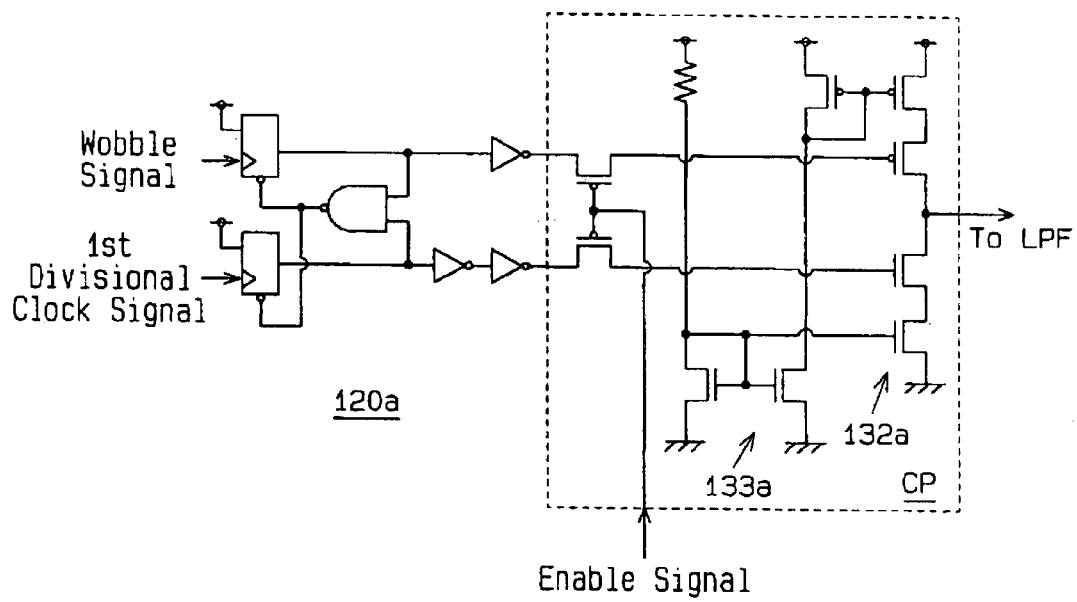
FIG. 9 is a schematic circuit diagram of a rising edge comparator and a charge pump unit in the data recording controller of FIG. 1.

FIG. 9 is a schematic circuit diagram of the rising edge comparator 120a and one of the charge pump units CP. As shown in FIG. 9, the charge pump unit CP includes an output section 132a, which outputs a signal corresponding to a comparison output signal from the rising edge comparator 120a, and a bias circuit 133a, which adjusts the output of the output section 132a.

When the rising edge of the wobble signal is earlier than the rising edge of the first divisional clock signal, the output section 132a generates a high potential signal (charge operation) from when the wobble signal goes high to when the divisional clock signal goes high. Further, when the rising edge of the first divisional clock signal is earlier than the rising edge of the wobble signal, the output section 132a generates a low potential signal (discharge operation) from when the first divisional signal goes high to when the wobble signal goes high.

In the charge pump 130a, the charge current and discharge current are set to be equal to each other when the period of the charge operation and the period of the discharge operation are the same.

The rising edge comparator 120a generates a predetermined output signal with the charge pump 130a from when one of the wobble signal and the first divisional clock signal goes high to when the other one of these signals goes high. The wobble signal and the first divisional clock signal are provided to different flip-flops (F/F). Each flip-flop outputs a high signal in synchronism with the rising edge of the provided pulse. When the pulses provided to the two flip-flops both go high, the two flip-flops are reset to interrupt the output of the signal from the charge pump 130a.

The trailing edge comparator 120b and the charge pump 130b of FIG. 1 are configured in the same manner as the rising edge comparator 120a and the charge pump 130a. Referring to FIG. 1, the signal input to the rising edge comparator 120a is inverted by an inverter and input to the trailing edge comparator 120b.

Figure 10:
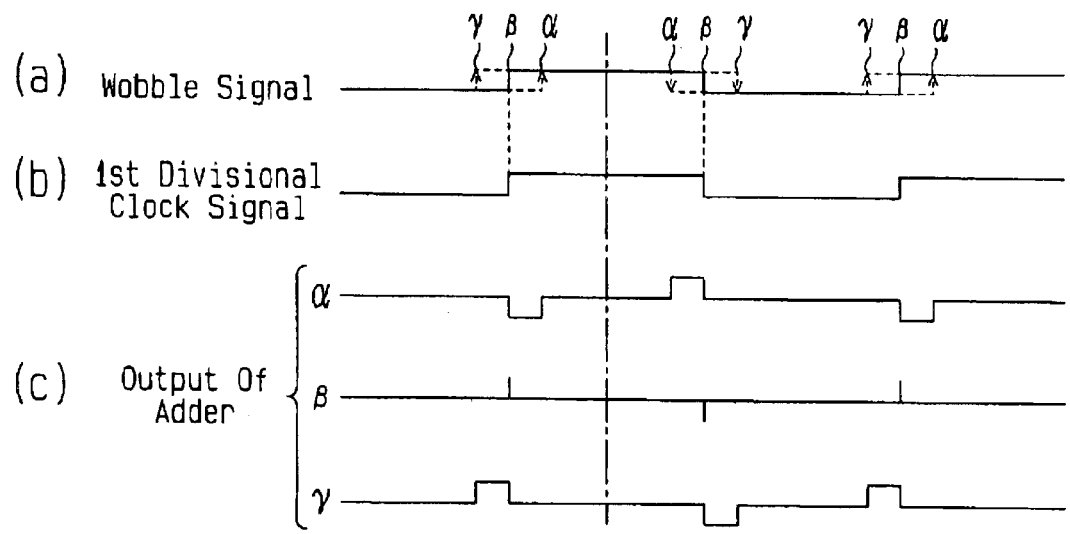
FIG. 10 is a time chart illustrating the characteristic of a clock signal, the frequency of which is synchronized with the wobble signal.

FIG. 10 shows the relationship between the signal input to the rising edge comparator 120a and the trailing edge comparator 120b and the output of the adder 140. As shown in FIG. 10(b), when the timing of the rising edge and trailing edge of the first divisional clock signal is the same as the timing of the rising edge and trailing edge of the wobble signal (as indicated by β in FIG. 10(a)), the output of the adder 140 is substantially zero.

In comparison, when the pulse width of the wobble signal (as indicated by α in FIG. 10(a)) is smaller than the pulse width of the first divisional clock signal, the adder 140 generates a low potential signal (performs the discharge operation as indicated by α in FIG. 10(c)) from when the first divisional clock signal goes high to when the wobble signal goes high. During the period from when the wobble signal goes low to when the first divisional clock signal goes low, the adder 140 generates a high potential signal (performs the charge operation as indicated by α in FIG. 10(c)). The period from when the first divisional clock signal goes high to when the wobble signal goes high is equal to the period from when the wobble signal goes low to when the first divisional clock signal goes low. Thus, the discharge current and the charge current are equal to each other.

When the pulse width of the wobble signal is greater than the pulse width of the first divisional clock signal (as indicated by γ in FIG. 10(a)), the adder 140 generates a high potential signal (performs the charge operation as indicated by γ in FIG. 10(c)) from when the wobble signal goes high to when the first divisional clock signal goes high. During the period from when the first divisional clock signal goes low to when the wobble signal goes low, the adder 140 generates a low potential signal (performs the discharge operation as indicated by γ in FIG. 10(c)). The period from when the wobble signal goes high to when the first divisional clock signal goes high is equal to the period from when the first divisional clock signal goes low to when the wobble signal goes low. Thus, the charge current and the discharge current are equal to each other.

When the pulse center of the first divisional clock signal and the wobble signal are equal, the charge current is equal to the discharge current in the charge pumps 130a and 130b. Accordingly, the pulse centers of the wobble signal and the first divisional clock signal are coincided with each other regardless of differences in the pulse widths of the wobble signal and the first divisional clock signal.

The second loop B of FIG. 1 will now be discussed. The second loop B predicts the period in which the LPP signal is detected to distinguish the LPP signal, which is provided to the clock generator 100 from the decoder 30, from noise. A command section 172 stores the time the LPP signal was first detected when starting the recording of data and counts, for example, clock pulses to calculate the period from when the LPP signal is detected to when the next LPP signal is detected. The command section 172 generates a window pulse at predetermined cycles in synchronism with the timing at which the LPP signal is likely to be detected. The pulse width of the window pulse covers the period during which there is a possibility that the LPP signal may be detected. If the LPP signal is detected when the window pulse is being provided, an LPP output section 174 outputs the LPP signal. This prevents noise from being erroneously detected as the LPP signal.

A phase comparator 150 compares the phase of the LPP signal with the phase of the second divisional clock signal, which is generated by dividing the clock signal with the second divider 176. The phase comparator 150 generates a comparison signal in accordance with the comparison result. A charge pump 160 converts the comparison signal so that it has a predetermined output level and provides the converted signal to a low pass filter 170. The low pass filter 170 smoothes the comparison signal and generates the second control voltage Vb, which is provided to the second control voltage input terminal INb of the VCO 110.

The dividing ratio of the second divider 176 is "1/5952." The second divider 176 generates the second divisional clock signal, which is offset from the LPP signal by a predetermined phase. The phase comparator 150 generates the comparison signal only when receiving the LPP signal from the LPP output section 174. This controls the frequency of the clock signal to be 52.32 MHz.

Figure 11:
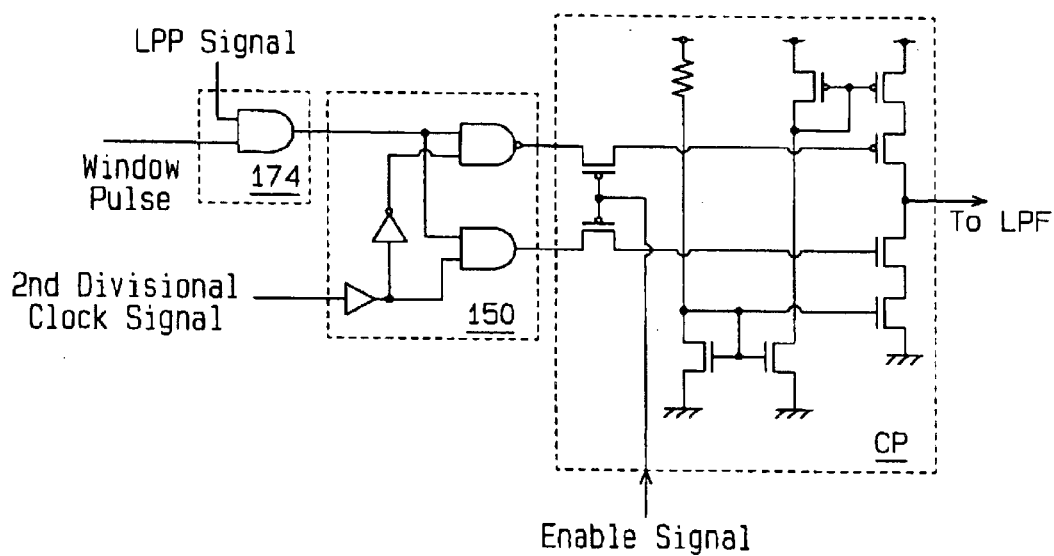
FIG. 11 is a circuit diagram of a phase comparator and a charge pump unit in the data recording controller of FIG. 1.

The comparison between the LPP signal and the second divisional clock signal, or the rising edge of the second divisional clock signal provided to the phase comparator 150 is controlled so that it coincides with the pulse center of the LPP signal. To perform such control, the LPP output section 174 and the phase comparator 150 may be configured as shown in FIG. 11. A charge pump unit CP, which is connected to the output side of the phase comparator 150, is arranged in the charge pump 160. The charge pump 160 is configured in the same manner as the charge pump 130a of FIG. 8.

Figure 12:
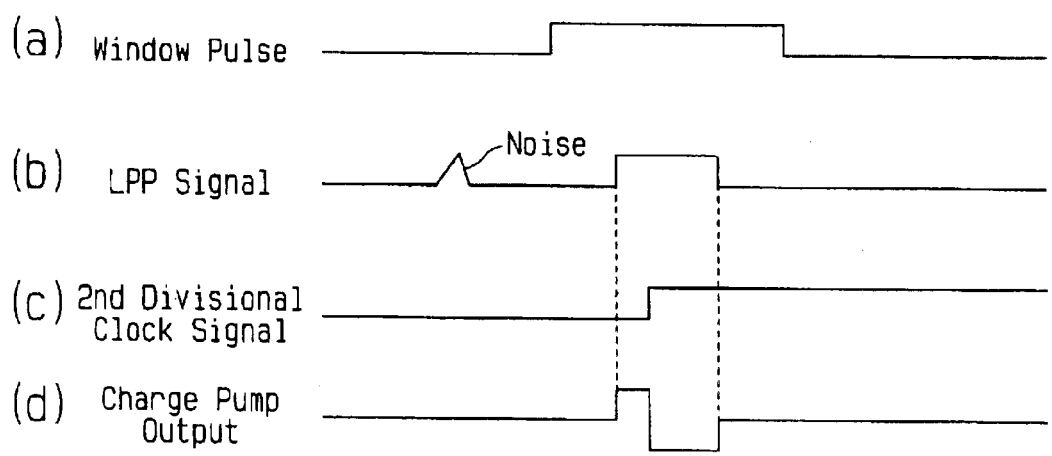
FIG. 12 is a time chart illustrating the characteristic of a clock signal, the phase of which is synchronized with the LPP signal.

FIG. 12 shows the relationship between the window pulse, the LPP signal, the second divisional clock signal, and the output of the charge pump 160. When the window pulse is not provided to the LPP output section 174, noise is not provided to the phase comparator 150 even when noise is mixed in the LPP signal (refer to FIGS. 12(a) and 12(b)). If the LPP signal is provided to the LPP output section 174 when the window pulse is provided to the LPP output section 174 (refer to FIGS. 12(a) and 12(b)), the LPP signal is provided to the phase comparator 150. As a result, the charge pump 160 generates a high potential signal from when the LPP signal is provided to the phase comparator 150 to when the second divisional clock signal goes high. If the second divisional clock signal goes high when the LPP signal is being provided, the charge pump 160 generates a low potential signal (refer to FIGS. 12(c) and 12(d)).

When the charge operation time and discharge operation time are the same, the charge pump 160 equalizes the charge current and the discharge current. Thus, when the rising edge of the second divisional clock signal is located at the pulse center of the LPP signal, the charge current and the discharge current are equalized. In such manner, the VCO 110 is controlled so that the rising edge of the second divisional clock signal coincides with the pulse center of the LPP signal in accordance with the output signal of the charge pump 160.

The fine adjustment with the second loop B synchronizes the frequency of the clock signal with the frequency of the wobble signal and the phase of the clock signal with the phase of the LLP signal. Thus, even if the center of the LPP signal is not coincided with the center of the wobble signal as shown by the broken lines in FIG. 7(d), the phase of the clock signal is synchronized with the phase of the LPP signal.

A circuit for performing the two processes of rough adjustment and fine adjustment to synchronize the frequency of the clock signal with the frequency of the wobble signal and then synchronize the phase of the clock signal with the phase of the LPP signal will now be discussed.

Referring to FIG. 1, to perform the rough and fine adjustments, the clock generator 100 includes a first monitor circuit 180, a second monitor circuit 182, a voltage generation circuit 184, and a control circuit 186.

The first monitor circuit 180 retrieves the wobble signal and the first divisional clock signal to monitor whether the frequency synchronization of the wobble signal and the first divisional clock signal in the first loop A has been completed. The second monitor circuit 182 retrieves the LPP signal and the second divisional clock signal and monitors the state of the LPP signal and the second divisional clock in the second loop B.

Referring to FIG. 13, the voltage generation circuit 184, which includes a voltage generation section 184c and a decoder 184d, generates a predetermined DC voltage. The voltage generation section 184c generates a plurality of different voltages. The decoder 184d decodes a command signal, which is provided from the control circuit 186, and selectively switches the value of the voltage generated by the voltage generation section 184c. Referring to FIG. 1, a switching circuit 185 selectively supplies a predetermined DC voltage to the low pass filter 170.

In accordance with a mode signal provided from an external device, the control circuit 186 controls the charge pumps 130a, 130b, and 160, the voltage generation circuit 184, and the switching circuit 185. The mode signal designates the speed for recording data. In the data recording controller 200, for example, a microcomputer, which controls the entire device, generates the mode signal.

The rough adjustment of the clock signal with the first loop A and the fine adjustment of the clock signal with the second loop B that are controlled by the control circuit 186 will now be discussed.

The microcomputer first provides the control circuit 186 with the mode signal to write mode data to the register 115a in the gain control circuit 115 of FIG. 2. In accordance with the mode data, the VCO 110 sets the current sources 112 and 114 so that the gain optimally corresponds to the data recording speed (linear velocity related to rotation of the optical disc 1). In other words, the VCO 110 sets the current sources 112 and 114 to obtain the gain (drive capacity) that is optimal for controlling the oscillation frequency in correspondence with the data recording speed. During gain adjustment, it is preferred that the gain be increased as the data recording speed increases.

The control circuit 186 sets the drive capacities of the charge pumps 130a and 130b to optimally correspond to the data recording speed. In other words, the control circuit 186 sets the drive capacities in optimal correspondence with the data recording speed (linear velocity related to the rotation of the optical disc 1). The setting of the drive capacities of the charge pumps 130a and 130b with the control circuit 186 is performed by providing a command signal to the gain switching circuit 131a of FIG. 8 or a corresponding circuit. During the adjustment of the drive capacity, it is preferred that the drive capacity be increased as the data recording speed increases.

In accordance with the mode signal, the control circuit 186 generates a command signal, which is provided to the decoder 184d of the voltage generation circuit 184. Further, the control circuit 186 switches the switching circuit 185 to apply the DC voltage of the voltage generation circuit 184 to the low pass filter 170 and inactivates the charge pump 160. In other words, the control circuit 186 does not apply an enable signal to all of the charge pump units CP to inactivate the charge pump 160. This completes the initial setting with the clock generator 100.

Subsequent to the initial setting, when the clock generator 100 is provided with the wobble signal, the frequencies of the first divisional clock signal and the wobble signal are synchronized in the first loop A. In this state, the charge pump 160 in the second loop B is inactivated. The DC voltage of the voltage generation circuit 184, or a constant voltage, is applied to the second control voltage input terminal INb of the VCO 110. At this point, the second loop B performs open loop control.

In the first loop A, when the first monitor circuit 180 detects that the difference between the frequencies of the first divisional clock signal and the wobble signal are converged within a predetermined range, the control circuit 186 switches the second loop B to closed loop control. That is, the control circuit 186 inactivates a predetermined number of charge pump units CP in the charge pump 160 and switches the switching circuit 185 so that the voltage of the voltage generation circuit 184 is not applied to the low pass filter 170. This applies a voltage, which corresponds to the difference between the phases of the second divisional clock signal and the LPP signal, to the second control voltage input terminal INb of the VCO 110.

Further, the control circuit 186 lowers the drive capacities of the charge pumps 130*a* and 130*b*. This causes the load on the first loop A to be less than the load on the second loop B after the difference between the frequencies of the wobble signal and the first divisional signal becomes small. Thus, the second loop B is hardly affected by the first loop A, and the second loop B properly performs fine adjustment of the clock signal.

When the first loop A is performing the rough adjustment, the voltage generation circuit 184 applies a constant (DC) voltage on the second control voltage input terminal INb of the VCO 110. This smoothly switches the second loop B to fine adjustment. That is, when the charge pump 160 is switched from an inactivated state to an activated state, the oscillation frequency is prevented from suddenly fluctuating due to sudden changes in the value of the voltage applied to the second control voltage input terminal INb of the VCO 110.

It is preferred that the DC voltage supplied to the second control voltage input terminal INb from the voltage generation circuit 184 be about the same as the voltage applied to the second control voltage input terminal INb when the second loop B synchronizes the phases of the second divisional clock signal and the LPP signal. This prevents the value of the DC voltage from suddenly fluctuating when the charge pump 160 is activated. It is preferred that the value of the DC voltage be a median value between maximum and minimum values of the voltage applied to the second control voltage input terminal INb.

The data recording controller 200 of the preferred embodiment has the advantages described below.

(1) A constant voltage is applied to the second control voltage input terminal INb of the VCO 110 until the first loop A converges the difference between the frequencies of the wobble signal and the first divisional signal in a predetermined range. After the frequency difference is converged within the predetermined range, the second control voltage is applied to the second control voltage input terminal INb in correspondence with the phase difference between the LPP signal and the second divisional clock signal. The control voltage applied to the second control voltage input terminal INb is switched to suppress changes in the oscillation frequency of the VCO 110 when switching the second loop B from open loop control to closed loop control.

(2) The voltage generation circuit 184 generates a plurality of DC voltages having different voltage values. Thus, the DC voltage applied to the second control voltage input terminal INn optimally corresponds to the rotation velocity of the optical disc 1.

(3) The first loop A and the second loop B share the same VCO 110, which has the two control voltage input terminals INa and INb. This reduces the circuit scale of the clock generator 100.

(4) The VCO 110 includes the first and second current sources 112 and 114. This enables the features of the VCO 110 to be varied in accordance with the setting of the rotation velocity of the optical disc 1.

(5) The gains of the charge pumps 130*a* and 130*b* in the first loop A are variable and decreased when switching from rough adjustment to fine adjustment. Thus, the second loop B performs fine adjustment.

(6) The command section 172 predicts the timing in which the LPP signal is detected, and processing with the phase comparator 150 is enabled only at the predicted timing. This prevents noise from being erroneously recognized as the LPP signal.

(7) The rising edges and trailing edges of the first divisional clock signal and the wobble signal are compared. This controls the VCO 110 without being affected by changes in the duty ratio of the reproduced wobble signal.

It should be apparent to those skilled in the art that the present invention may be embodied in many other specific forms without departing from the spirit or scope of the invention. Particularly, it should be understood that the present invention may be embodied in the following forms.

Instead of the wobble signal, the divided wobble signal may be provided to the first loop A.

Instead of the LPP signal, the divided LPP signal may be provided to the second loop B.

The gain of the VCO 110 does not necessarily have to be variably set in accordance with the rotation velocity of the optical disc 1. For example, the characteristics of the clock generator 100 may be adjusted by varying the voltage of the charge pumps 130*a*, 130*b*, and 160 or by varying the voltage of the voltage generation circuit 184 in accordance with the rotation velocity of the disc medium. In such case, it is preferred that the output voltage of the voltage generation circuit 184 be set at a higher voltage as the rotation velocity of the optical disc 1 increases, such as when performing 2× speed recording.

The configuration of the VCO 110 is not limited to that illustrated in FIG. 2. For example, the current control device for controlling the amount of current supplied to each inverter IV of the ring oscillator 118 does not have to be configured by the n-channel transistor and the p-channel transistor.

The initial gain setting of the VCO 110 may be changed when the clock generator 100 is being activated. This is especially effective when applying the clock generator 100 to a device that records data at a constant angular velocity.

During the comparison of the wobble signal and the first divisional clock signal in the first loop A, instead of comparing both rising and trailing edges, only the rising edges of the two signals may be compared.

In cases in which noise is not erroneously detected as the LPP signal, the generation of the window pulse with the command section 172 of FIG. 1 does not have to be performed.

The first loop A and the second loop B may include different VCOs. In this case, the voltage applied to the control voltage input terminal of the VCO in the second loop B is switched to suppress fluctuation in the oscillation frequency of the VCO.

Under circumstances in which signals having difference frequencies exist, the application of the PLL circuit of the present invention is effective when it is desired that the clock signal be generated with a phase accurately synchronized to that of a signal, which is difficult to be synchronized since its frequency is low.

The present examples and embodiments are to be considered as illustrative and not restrictive, and the invention is not to be limited to the details given herein, but may be modified within the scope and equivalence of the appended claims.

What is claimed is:

1. A PLL circuit for use with first and second reference signals, with each reference signal having a phase, cycle, and frequency, and the cycle of the second reference signal being longer than that of the first reference signal, the PLL circuit comprising:

a voltage controlled oscillator for generating a clock signal in accordance with a control voltage, and the clock signal having a phase and frequency;

a first loop for controlling the frequency of the clock signal in accordance with the first reference signal; and a second loop for controlling the phase of the clock signal in accordance with the second reference signal with the second loop generating the control voltage at a constant value and supplying the voltage controlled oscillator with the constant control voltage until the difference between the frequency of the first reference signal and the frequency of the clock signal converges to within a predetermined range, and thereafter the second loop generating the control voltage at a level in accordance with the difference between the chase of the second reference signal and the phase of the clock signal and supplying the voltage controlled oscillator with the control voltage at the level in accordance with said phase difference, wherein the second loop includes:

a voltage generation section for generating a plurality of constant control voltages having different constant voltage values; and a decoder for selecting one of the constant control voltages in accordance with a predetermined control signal, with the second loop supplying the voltage controlled oscillator with the constant control voltage selected by the decoder until the difference between the frequency of the first reference signal and the frequency of the clock signal converges to within the predetermined range.

2. The PLL circuit according to claim 1, wherein the voltage controlled oscillator includes:

a first input terminal for receiving a first control voltage corresponding to the first loop;

a second input terminal for receiving a second control voltage corresponding to the second loop; and a ring oscillator for generating the clock signal in accordance with the first and second control voltages;

the first loop generating the first control voltage at an amount in accordance with the difference between the frequency of the first reference signal and the frequency of the clock signal and applying the first control voltage to the first input terminal; and the second loop generating the second control voltage at said level in accordance with the difference between the phase of the second reference signal and the phase of the clock signal and applying the second control voltage to the second input terminal.

3. The PLL circuit according to claim 1, wherein the first loop includes:

a phase comparator for generating a comparison signal corresponding to the difference between the frequency of the first reference signal and the frequency of the clock signal; and a charge pump connected to the phase comparator to control current in accordance with the comparison signal, the charge pump including a variable drive capacity and decreasing the drive capacity after the difference between the frequency of the first reference signal and the frequency of the clock signal has been converged to within the predetermined range.

4. The PLL circuit according to claim 3, wherein the first reference and clock signals each have rising and trailing edges and the phase comparator includes:

a rising edge comparator for generating one signal in accordance with the difference between the timing of the rising edge of the first reference signal and the rising edge of the clock signal; and a trailing edge comparator for generating another signal in accordance with the difference between the timing of the trailing edge of the first reference signal and the trailing edge of the clock signal;

the charge pump includes:

a first charge pump connected to the rising edge comparator; and a second charge pump connected to the trailing edge comparator;

the first loop includes:

an adder connected to the first and second charge pumps to synthesize the outputs of the first and second charge pumps.

5. The PLL circuit according to claim 1, wherein the first loop includes:

a first divisional circuit connected to the voltage controlled oscillator to divide the clock signal with a first dividing ratio and generate a first divisional clock signal having a frequency;

the second loop includes:

a second divisional circuit connected to the voltage controlled oscillator to divide the clock signal with a second dividing ratio and generate a second divisional clock signal having a phase, and the second loop supplies the voltage controlled oscillator with the constant control voltage until the difference between the frequency of the first reference signal and the frequency of the first divisional clock signal converges to within the predetermined range, and thereafter the second loop supplies the voltage controlled oscillator with the control voltage at the level in accordance with the difference between the phase of the second reference signal and the phase of the second divisional clock signal.

6. The PLL circuit according to claim 5, wherein the second loop includes:

a phase comparator for generating a comparison signal corresponding to the difference between the phase of the second reference signal and the phase of the second divisional clock signal; and a charge pump connected to the phase comparator to generate the control voltage at the level in accordance with the difference between the phase of the second reference signal and the phase of the second divisional clock signal, and the charge pump is inactivated until the difference between the frequency of the first reference signal and the frequency of the first divisional clock signal is converged to within the predetermined range.

7. A data recording controller for generating a data write clock signal having a phase and frequency with a first signal indicating position information obtained from a disc medium, the rotation of which is controlled, and a second signal, the first and second signals each having a chase, cycle, and frequency, and the cycle of the second signal being longer than that of the first signal, the data recording controller including:
- a voltage controlled oscillator for generating the clock signal in accordance with a control voltage;
- a first loop for controlling the frequency of the clock signal in accordance with the first signal; and
- a second loop for controlling the phase of the clock signal in accordance with the second signal, with the second loop generating the control voltage at a constant value and supplying the voltage controlled oscillator with the constant control voltage until the difference between the frequency of the first signal and the frequency of the clock signal converges to within a predetermined range, and thereafter the second loop generating the control voltage at a level in accordance with the difference between the phase of the second signal and the phase of the clock signal and supplying the voltage controlled oscillator with the control voltage at the level in accordance with said phase difference, wherein the second loop includes:
- a voltage generation section for generating a plurality of constant control voltages having different constant voltage values; and
- a decoder for selecting one of the constant control voltages in accordance with a predetermined control signal, with the second loop supplying the voltage controlled oscillator with the constant control voltage selected by the decoder until the difference between the frequency of the first signal and the frequency of the clock signal converges to within the predetermined range.

8. The data recording controller according to claim 7, wherein the voltage controlled oscillator includes:
- a first input terminal for receiving a first control voltage corresponding to the first loop;
- a second input terminal for receiving a second control voltage corresponding to the second loop; and
- a ring oscillator for generating the clock signal in accordance with the first and second control voltages;
- the first loop generating the first control voltage at an amount in accordance with the difference between the frequency of the first signal and the frequency of the clock signal and applying the first control voltage to the first input terminal; and
- the second loop generating the second control voltage at said level in accordance difference between the phase of the second signal and the phase of the clock signal and applying the second control voltage to the second input terminal.

9. The data recording controller according to claim 7, wherein the first loop includes:
- a phase comparator for generating a comparison signal corresponding to the difference between the frequency of the first signal and the frequency of the clock signal; and
- a charge pump connected to the phase comparator to control current in accordance with the comparison signal, wherein the charge pump has a variable drive capacity and decreases the drive capacity after the difference between the frequency of the first signal and the frequency of the clock signal is converged to within the predetermined range.

10. The data recording controller according to claim 9, wherein the first signal and clock signal each having rising and trailing edges and the phase comparator includes:
- a rising edge comparator for generating one signal in accordance with the difference between the timing of the rising edge of the first signal and the rising edge of the clock signal; and
- a trailing edge comparator for generating another signal in accordance with the difference between the timing of the trailing edge of the first signal and the trailing edge of the clock signal;
- the charge pump includes:
- a first charge pump connected to the rising edge comparator; and
- a second charge pump connected to the trailing edge comparator;
- the first loop includes:
- an adder connected to the first and second charge pumps to synthesize the outputs of the first and second charge pumps.

11. The data recording controller according to claim 9, wherein the first loop includes:
- a first divisional circuit connected to the voltage controlled oscillator to divide the clock signal and generate a first divisional clock signal having a frequency;
- the second loop includes:
- a second divisional circuit connected to the voltage controlled oscillator to divide the clock signal and generate a second divisional clock signal having a phase, and the second loop supplies the voltage controlled oscillator with the control voltage at the constant value until the difference between the frequency of the first signal and the frequency of the first divisional clock signal converges to within a predetermined range, and thereafter the second loop generates the control voltage at the level in accordance with the difference between the phase of the second signal and the phase of the second divisional clock signal and supplies it to the voltage controlled oscillator.

12. The data recording controller according to claim 11, wherein the second loop includes:
- a phase comparator for generating a comparison signal corresponding to the difference between the phase of the second signal and the phase of the second divisional clock signal; and
- a charge pump connected to the phase comparator to generate the control voltage at the level in accordance with the difference between the phase of the second signal and the phase of the second divisional clock signal, and the charge pump is inactivated until the difference between the frequency of the first reference signal and the frequency of the first divisional clock signal is converged to within the predetermined range.

13. A method for controlling a voltage controlled oscillator of a PLL circuit, the method comprising:
- supplying the voltage controlled oscillator with a control voltage to generate a clock signal, which has a frequency and phase, in accordance with the control voltage;

controlling the frequency of the clock signal in accordance with a first signal having a frequency and cycle; and controlling the chase of the clock signal in accordance with a second signal having a phase and a cycle with the cycle of the second signal being longer than the cycle of the first signal;

wherein said controlling the phase of the clock signal includes:

generating the control voltage at a constant value and supplying the voltage controlled oscillator with the constant control voltage until the difference between the frequency of the first signal and the frequency of the clock signal converges to within a predetermined range; and generating a voltage at a level in accordance with the difference between the phase of the second signal and the phase of the clock signal and supplying the voltage controlled oscillator with the voltage at the level in accordance with the phase difference after the difference between the frequency of the first signal and the frequency of the clock signal has been converged to within the predetermined range;

generating a plurality of constant control voltages having different constant voltage values; and selecting one of the constant control voltages in accordance with a predetermined control signal; and supplying the voltage controlled oscillator with the selected constant control voltage until the difference between the frequency of the first signal and the frequency of the clock signal is converged to within the predetermined range.

14. The method according to claim 13, further comprising:

dividing the clock signal with a first dividing ratio to generate a first divisional clock signal having a frequency; and dividing the clock signal with a second dividing ratio to generate a second divisional clock signal having a phase;

wherein said controlling the phase of the clock signal includes:

generating a control voltage at the constant value and supplying the voltage controlled oscillator with the constant control voltage until the difference between the frequency of the first signal and the frequency of the first divisional clock signal is converged to within a predetermined range; and generating the control voltage at the level corresponding to the difference between the phase of the second signal and the phase of the second divisional clock signal and supplying it to the voltage controlled oscillator after the frequency of the first signal and the frequency of the first divisional clock signal have been converged within the predetermined range.

* * * * *

UNITED STATES PATENT AND TRADEMARK OFFICE
CERTIFICATE OF CORRECTION

PATENT NO. : 6,914,465 B2 Page 1 of 1
DATED : July 5, 2005
INVENTOR(S) : Masashi Kiyose and Takuya Shiraishi It is certified that error appears in the above-identified patent and that said Letters Patent is hereby corrected as shown below:

<u>Title page, Item [54] and Column 1, line 3,</u>
Title, please change to read:
-- PLL CIRCUIT AND DATA RECORDING CONTROLLER EACH HAVING DUAL PHASE-LOCKED LOOP --.

Signed and Sealed this

Thirteenth Day of September, 2005

JON W. DUDAS
*Director of the United States Patent and Trademark Office*